United States Patent [19]
Turner

[11] Patent Number: 5,929,719
[45] Date of Patent: Jul. 27, 1999

[54] SHIELDED CABLE WITH IN-LINE ATTENUATOR

[76] Inventor: Mark Turner, 10363 East 'HJ' Ave., Galesburg, Mich. 49053-9712

[21] Appl. No.: 08/874,376

[22] Filed: Jun. 19, 1997

[51] Int. Cl.[6] ........................................................ H03H 7/24
[52] U.S. Cl. ........................ 333/81 R; 333/81 A; 174/36; 174/84 R
[58] Field of Search ......................... 333/81 R, 81 A, 333/12; 174/36, 84 R, 88 C

[56] References Cited

U.S. PATENT DOCUMENTS

| | | | |
|---|---|---|---|
| 2,452,737 | 11/1948 | Einstein et al. | 338/216 |
| 2,760,170 | 8/1956 | May | 333/81 A |
| 3,087,126 | 4/1963 | Szczuka | 333/28 R |
| 3,227,975 | 1/1966 | Hewlett et al. | 333/81 A |
| 3,260,971 | 7/1966 | Bacher et al. | 333/81 A |
| 3,422,212 | 1/1969 | Clark | 174/84 R |
| 3,521,201 | 7/1970 | Veteran | 333/81 A |
| 3,665,347 | 5/1972 | Barth | 333/81 A |
| 4,060,780 | 11/1977 | Nishida | 333/81 A |
| 4,618,839 | 10/1986 | Barth | 333/81 A |
| 4,779,064 | 10/1988 | Monser | 333/81 A |
| 4,997,992 | 3/1991 | Low | 174/24 |
| 5,039,961 | 8/1991 | Veteran | 333/81 A |
| 5,191,303 | 3/1993 | Porter et al. | 333/81 R |
| 5,301,208 | 4/1994 | Rhodes | 333/32 X |
| 5,382,932 | 1/1995 | Monti | 333/245 |

*Primary Examiner*—Robert Pascal
*Assistant Examiner*—Justin P. Bettendorf
*Attorney, Agent, or Firm*—Flynn, Thiel, Boutell & Tanis, P.C.

[57] ABSTRACT

An attenuated cable is formed with an in-line attenuator conducted between two cable lengths wherein the cable lengths are rigidly joined together by a rigid hollow housing which encloses the attenuator therein. The attenuator circuit is housed within the housing, and is electrically connected to the cable lengths without the use of mechanical connections therebetween. The free ends of the cable lengths farthest from the housing are provided with standard connectors for connecting the cable to additional electrical devices such as microphones, mixers or amplifiers. Since the housing and attenuator circuit are relatively small and light relative to the larger cable lengths, the attenuated cable has substantially the same weight and flexibility as a continuous length of cable.

23 Claims, 6 Drawing Sheets

SHIELDED CABLE WITH IN-LINE ATTENUATOR

FIELD OF THE INVENTION

The invention is directed to a flexible shielded cable for use with audio equipment, and more specifically, to an electrical cable assembly having a tubular housing joining two lengths of cable together and an in-line attenuator circuit formed integrally therewith which is enclosed within the housing.

BACKGROUND OF THE INVENTION

Conventional attenuators typically are unitary or self-contained electromechanical units which have a relatively heavy housing formed with mechanical connectors at each end, and an attenuator circuit positioned within the housing. These attenuators are serially connected to audio signal lines which typically have mating connectors at the ends thereof proximate the attenuator so as to mechanically couple the audio signal lines to the mechanical connectors of the attenuator. Audio signal lines also commonly have mechanical connectors at the ends thereof distal or farthest from the attenuator for connection to audio or signal devices, for example a microphone or an amplifier, at the distal end of the line.

Thus, the two electrical devices are connected together by the two separate audio lines and the conventional attenuator such that there are at least four mechanical connections between the electrical devices.

Figures 1, 2:
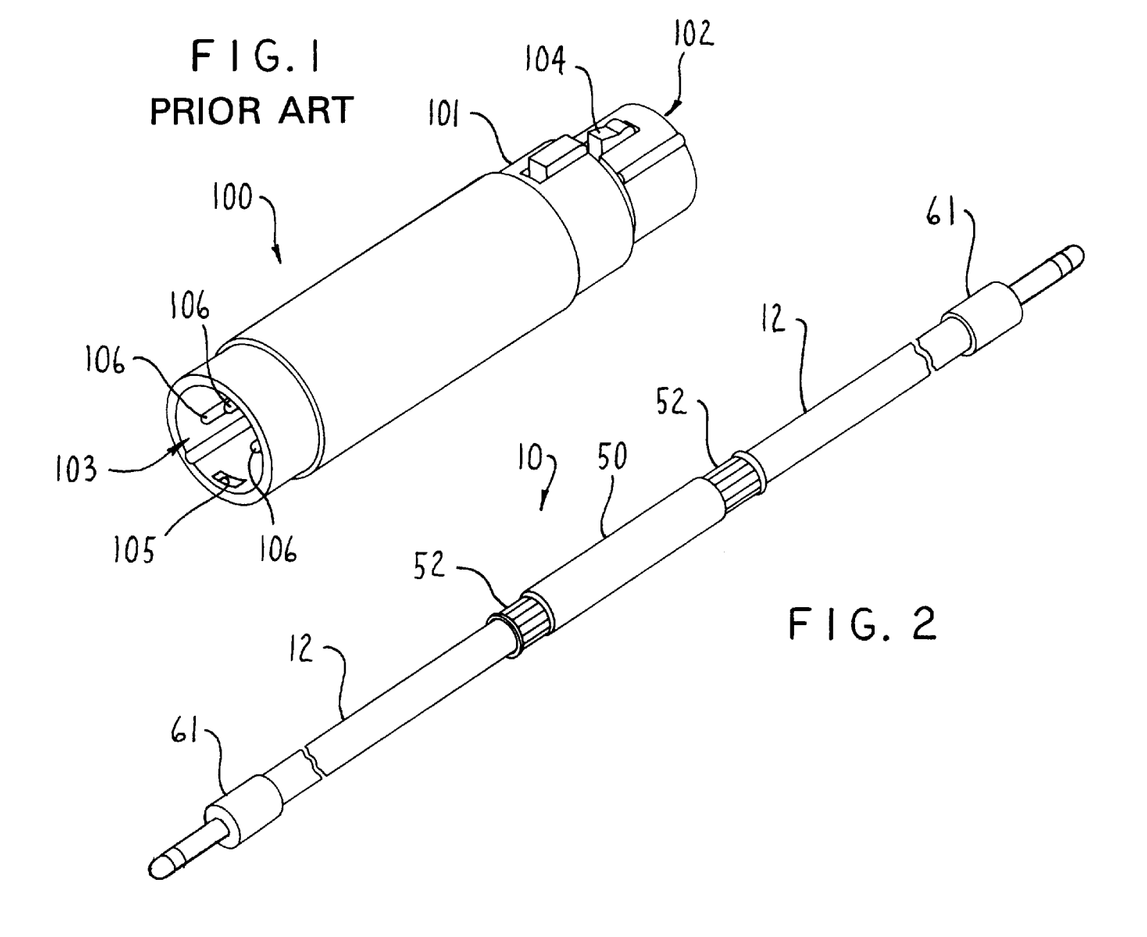
FIG. 1 is a perspective view of a conventional attenuator.
FIG. 2 is a broken perspective view showing the shielded cable with in-line attenuator of the present invention.
Figure 3:
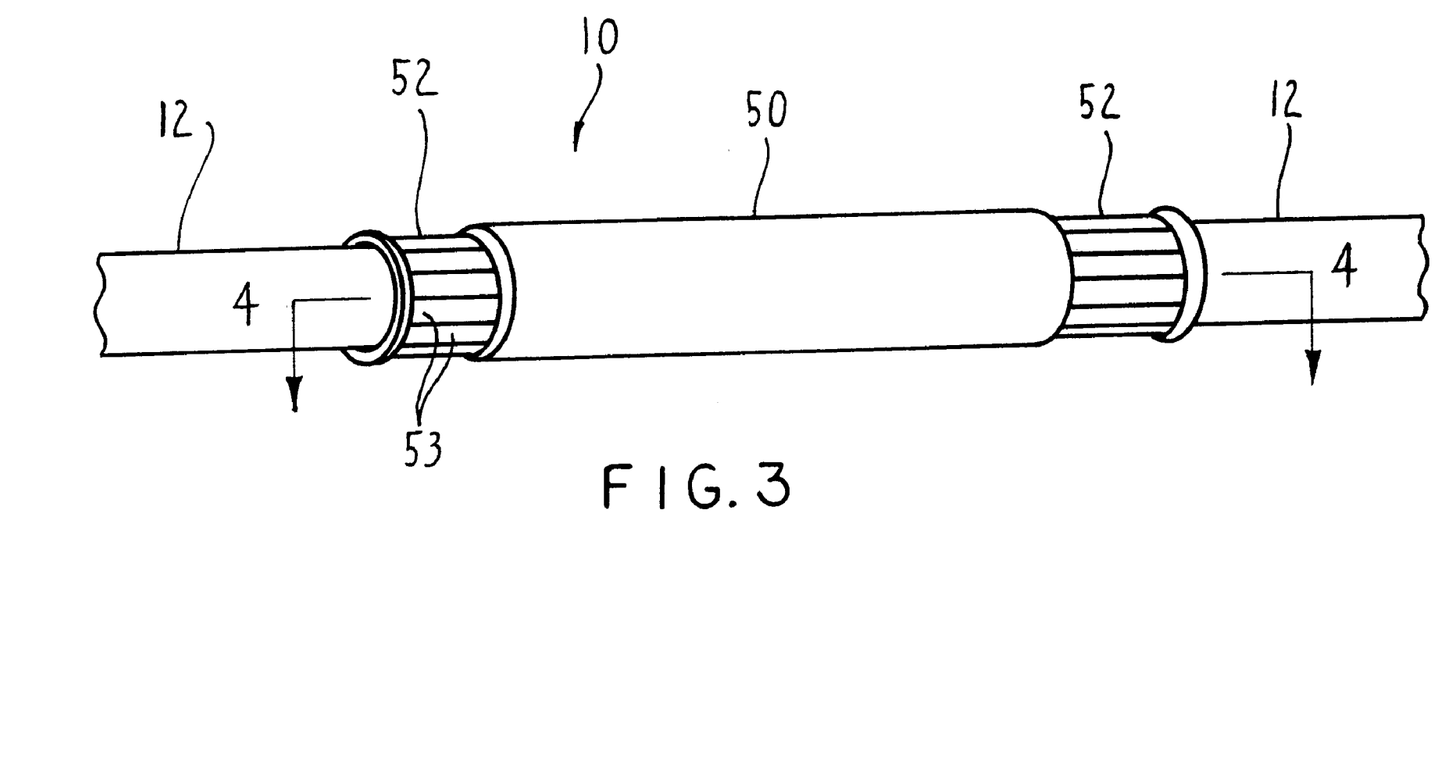
FIG. 3 is an enlarged partial perspective view of the shielded cable with in-line attenuator of the present invention.

FIG. 1 shows one example of a conventional attenuator 100 adapted to mechanically couple the ends of two separate audio signal lines (not illustrated) together. The attenuator 100 is relatively large and has a relatively heavy metallic housing 101 enclosing an attenuator circuit therein. The housing 101 has a male mechanical connector 102 and a female mechanical connector 103 at opposite ends thereof. The male mechanical connector 102 has a latch 104 which selectively secures the attenuator 100, and in particular, the male connector 102 thereof to a female connector (not illustrated) of one of the audio signal lines (not illustrated). The female connector 102 of the attenuator 100 has a slot 105 adapted to receive a selectable latch on a male connector (not illustrated) attached on the other of the audio signal lines (not shown). Thus, the attenuator 100 is mechanically connected to the audio signal lines (not illustrated) by the male mechanical connector 102 and the female mechanical connector 103.

To electrically connect the attenuator 100 to the audio signal lines, the mechanical connectors 102 and 103 connect the attenuator circuit contained in the housing 101 to the signal conducting wires thereof. In particular, the female mechanical connector 103 includes a plurality of pins, here shown partially by pins 106, which are received in slots (not illustrated) at the ends of conducting wires of one of the audio signal lines. The male connector 102 includes a plurality of conventional slots (not illustrated) which receive pins projecting from the other one of the audio signal lines. However, these mechanical connectors 102 and 103 form interference points along the electrical circuit created thereby at which points stray electromagnetic fields can introduce interference that causes significant noise to appear downline in the wiring system. The interface between two mechanically connected conductors can also introduce interference.

While FIG. 1 shows male and female mechanical connectors 103 and 102 on the attenuator 100, other attenuators may also have threaded mechanical couplings which have one end threaded into the housing of the attenuator. The opposite end of these couplings extends out from the attenuator housing and has external threads thereon for threaded engagement with a threaded connector that is attached to a signal line. Thus, the cable assembly extending from one electrical device to a second electrical device which is defined by an attenuator and two signal lines has six mechanical connections between the two electrical devices.

These types of connectors may also include ring nuts to more securely attach the threaded couplings to the signal line and attenuator. It is also known to use conventional coaxial jacks or coaxial connectors secured to the housing to attach the signal line thereto.

Examples of prior art attenuators are found in U.S. Pat. Nos.: 5,039,961; 4,779,064; 4,618,839; 4,060,780; 4,665,347; 3,260,971; 2,760,170; and 2,452,737.

Accordingly, it is an object of this invention to provide a shielded cable formed with an in-line attenuator between two lengths of cable. It is a further object that the cable be formed without additional detachable mechanical connectors connecting the attenuator to the two separate lengths of cable. It is still a further object that the inventive attenuator be integrally formed with the shielded cable.

It is also an object of the invention to provide a method for manufacturing the shielded cable with the inline attenuator such that the in-line attenuator is an integral part of the shielded cable.

In view of the foregoing, the inventive shielded cable includes an in-line attenuator circuit and two lengths of electrical cable which are electrically connected to the opposite end portions of the attenuator circuit so as to define the cable length. A hollow housing surrounds the attenuating circuit and has a compression coupling at each end of the housing for securing the housing onto the adjacent end portions of the cable so as to shield and protect the attenuator circuit therein without significantly altering the weight or flexibility of the shielded cable as a whole.

Other objects and purposes of the invention will be apparent to persons familiar with devices of this general type upon reading the specification and inspecting the accompanying drawings.

Certain terminology will be used in the following description for convenience in reference only, and will not be limiting. For example, the words "upwardly", "downwardly", "rightwardly" and "leftwardly" will refer to directions in the drawings to which reference is made. The words "inwardly" and "outwardly" will refer to directions toward and away from, respectively, the geometric center of the arrangement and designated parts thereof. Said terminology will include the words specifically mentioned, derivatives thereof, and words of similar import.

DETAILED DESCRIPTION

Figure 4:
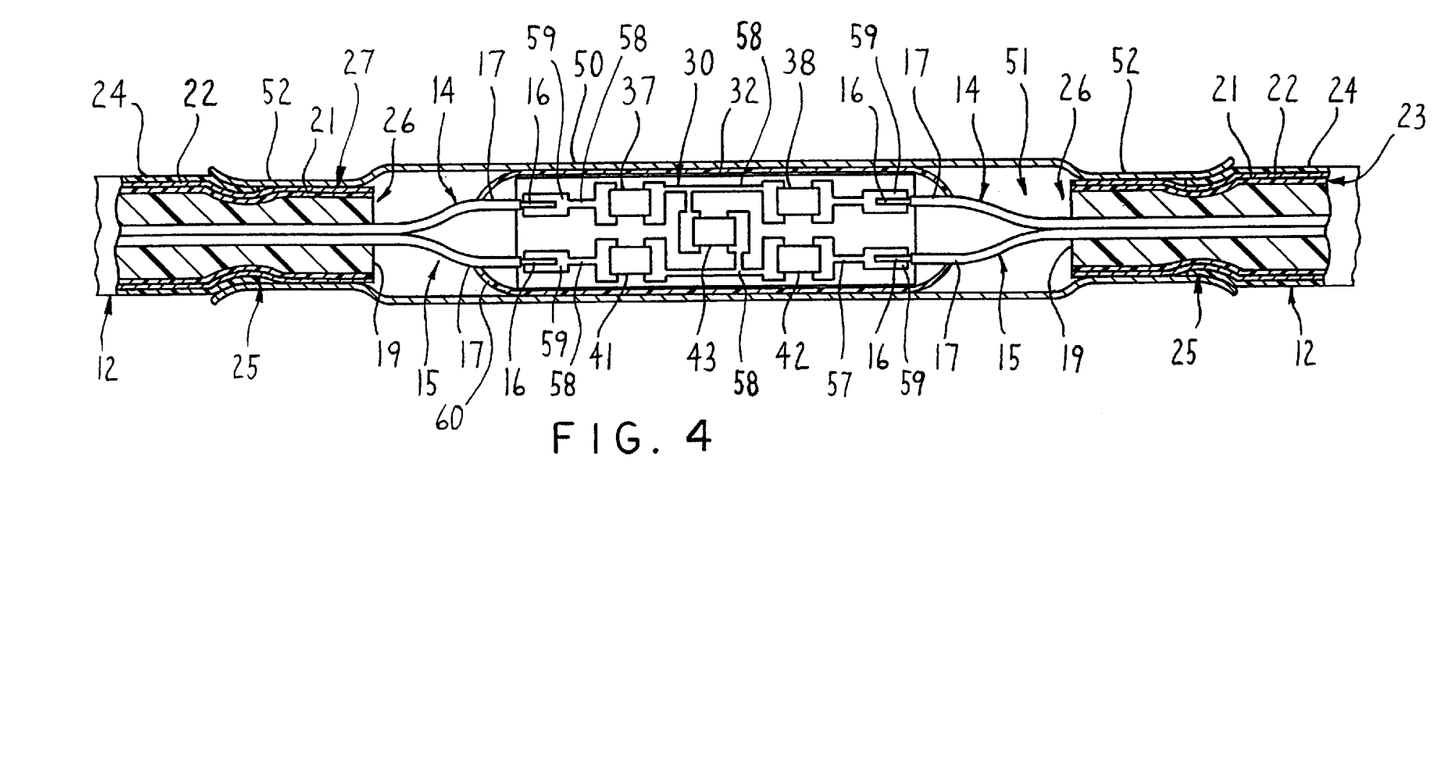
FIG. 4 is a cross-sectional view taken generally along line 4—4 in FIG. 3.

Referring to FIGS. 2 and 4, a shielded cable assembly 10 with in-line attenuator 30 (FIG. 4) is shown having two lengths of cable 12 which are joined together by a hollow housing 50. The hollow housing 50 is fixedly intermediately joined to the cable lengths 12. The attenuator circuit 30 is housed within the housing 50, and is electrically connected to the cable lengths 12 without the use of mechanical connections therebetween. The free ends of the cable lengths 12 farthest from the housing 50 may be provided with standard audio/electrical connectors 61 for connecting the cable assembly 10 to separate electrical devices (not illustrated) such as microphones, mixers or amplifiers. It should be particularly noted that FIG. 2 is shown generally to scale relative to the conventional attenuator illustrated in FIG. 1.

Generally, conducting wires 14, 15 (FIG. 4) are contained within the cable lengths 12 and are fixedly secured to the attenuator circuit 30 preferably by soldering such that the circuit 30 is formed integral with the cable lengths 12. The electrical connections between the attenuator circuit 30 and the wires 14, 15 have little mechanical strength. The rigid housing 50, however, is slid over the attenuator circuit 30 and the opposite ends thereof are connected to the adjacent portions of the cable lengths 12 by compression joints or connections. The housing 50 rigidly joins the two lengths of cable 12 together such that the housing 50 protects the circuit 30 as well as the electrical connections formed between the attenuator circuit 30 and the conducting wires 14, 15 of the cable lengths 12.

Since the housing 50 and attenuator circuit 30 are relatively light in weight compared to the cable lengths 12, the shielded cable assembly 10 has substantially the same weight and flexibility of the two cable lengths, even with the attenuating circuit 30 being positioned between the cable lengths 12 and being protected by the rigid housing 50. Further, the cable assembly 10 connects two electrical devices together with only two electrical connectors 61 being provided, thereby improving the signal performance of the cable assembly 10 between the two electrical devices.

More particularly, the cable lengths 12 each include two elongate signal conducting wires 14, 15 centrally located therein. Each signal conducting wire 14, 15 has a copper conductor 16 surrounded by a protective coating 17 (FIG. 4), preferably a thermoplastic coating such as neoprene or other suitable insulating material. The wires 14, 15 extend longitudinally along the entire length of the cable lengths 12.

To protect the wires 14, 15, a layer of insulation 19 is provided circumferentially about the wires 14, 15 within the cable length 12. The insulation 19 is a conventional paper-like insulation.

Further, a reinforced inner neoprene layer 21 is formed circumferentially around the two signal conducting wires 14, 15 and the insulation 19, thereby forming an inner concentric wire portion 23 having a generally circular cross section. This inner concentric wire portion 23 is flexible while maintaining the structural and electrical conducting integrity of the signal conducting wires 14, 15, and more specifically, the copper conductors 16 within the wires 14, 15.

Shielding 22 surrounds the outside of the inner neoprene layer 21 to protect the signal conducting wires 14, 15 from interference with other electronic devices producing stray electromagnetic signals or noise. The shielding 22 can be a conventional braided or wrapped copper wire shielding or a foil type shielding.

A reinforced outer neoprene layer 24 surrounds the shielding and holds it securely between the outer neoprene layer 24 and inner neoprene layer 21. Both neoprene layers 21, 24 can be reinforced by imbedded fibers between the inner and outer surfaces of the layers 21, 24.

As will be described in more detail hereinafter, the end section 27 of the outer neoprene layer 24 which is located adjacent to or proximate the attenuator circuit 30 defines mounting locations 25 at the ends 26 of the cable lengths 12 for the housing 50 which is rigidly secured thereon. In particular, the end section 27 of the cable length 12 on which the housing 50 is secured is a relatively short section of the overall length of the cable length 12 to thereby define the mounting locations 25.

The signal conducting wires 14, 15 themselves extend beyond the ends 26 of the cable lengths 12 and toward the attenuator circuit 30 disposed therebetween. In particular, the ends of the conducting wires 14, 15 extend axially beyond the end of the paper insulation 19, inner and outer neoprene layers 21, 24 and shielding 22 at the ends 26 of the cable length 12. Still further, the conductors 16 of the wires 14, 15 extend axially beyond the end of the thermoplastic coating 17 and are exposed so that the wires 14, 15 can be attached to the attenuating circuit 30.

As seen in FIG. 4, the wires 14, 15 are fixedly attached to the attenuator circuit 30, preferably by soldering. More particularly, the exposed ends of the copper conductors 16 are adapted to be soldered to the attenuator circuit 30 which provides a good electrical connection therebetween. While the use of solder has limited strength, the connection of the hollow housing 50 rigidly connects the adjacent ends of the cable lengths 12 together, while isolating or at least protecting the solder connections from the bending and flexing of the cable lengths 12 which occurs during use.

To connect the distal ends of the cable lengths 12 to additional electrical devices, the distal ends of the cable lengths 12 include the connectors 61 which are electrically connected to the wires 14, 15. In the illustrated embodiment of FIG. 2, the connector 61 is a conventional connector commonly referred to as a stereo phone plug. The skilled artisan will readily appreciate that other types of connectors may be used or that the ends of the cable lengths 12 may be hard wired to the separate electrical devices. These connectors 61 are conventional and thus, a more detailed disclosure is not believed necessary.

Figure 5:
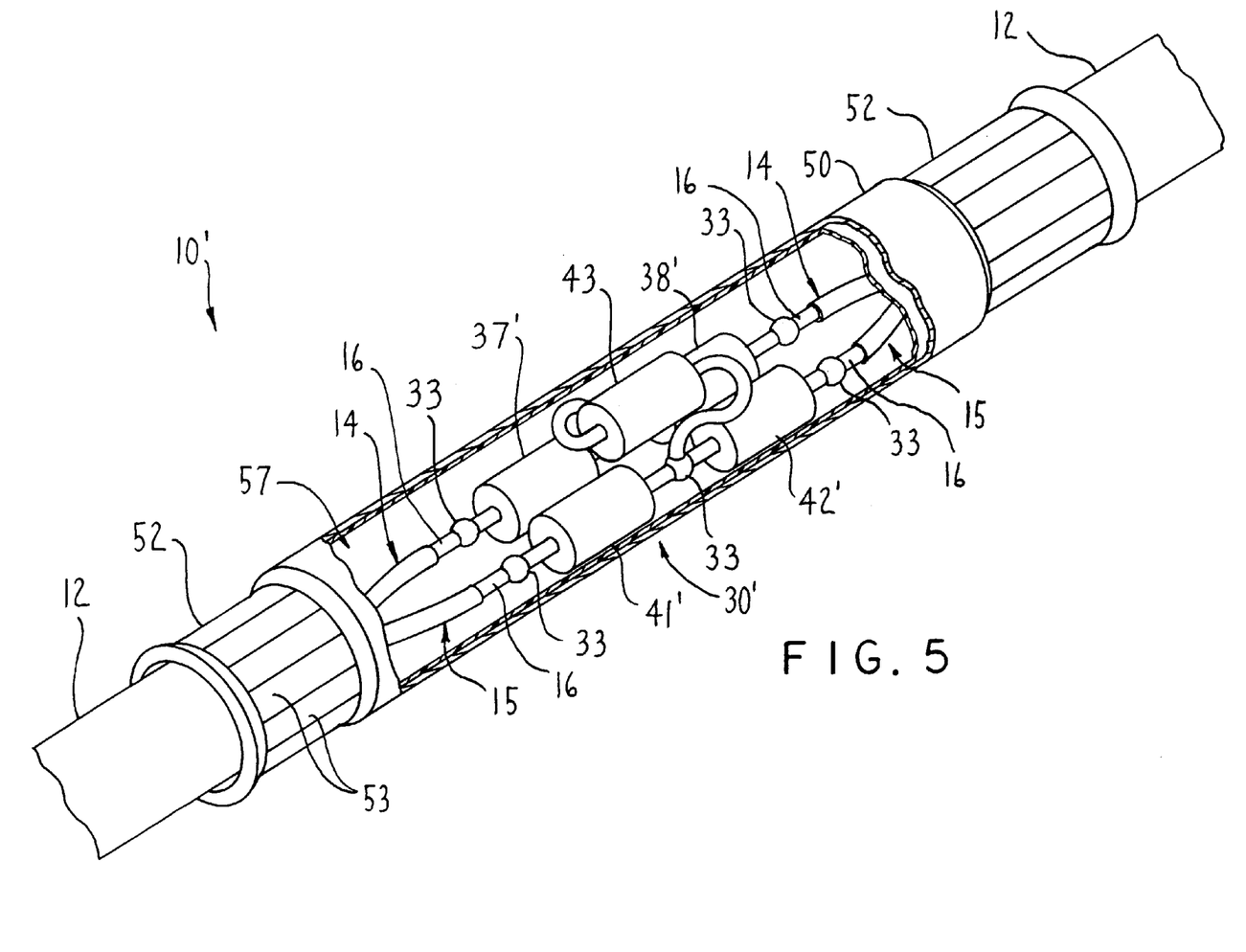
FIG. 5 is a partial cut away view of a modified shielded cable with in-line attenuator.

Generally with respect to the attenuating circuit 30, the attenuating circuit 30 is designed to provide proper matching of impedances and/or signal levels between audio devices or between other electrical circuits. As will be discussed in more detail hereinafter, FIG. 4 illustrates an attenuating circuit 30 mounted on a circuit board 32, and FIG. 5 illustrates an attenuating circuit 30 which is a soldered circuit held together at soldered locations 33 (FIG. 5). The attenuating circuit 30 is positioned between and electrically joins the pairs of signal conducting wires 14, 15 of the two cable lengths 12 together so as to transmit the electrical signal longitudinally along the cable assembly 10 from a source S to a load L as diagrammatically illustrated in FIGS. 6A and 6B.

Figure 6A:
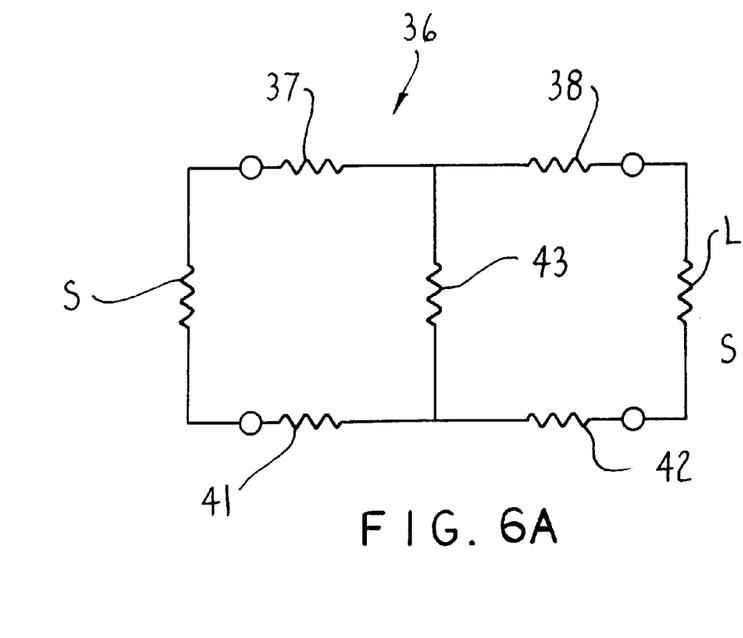
FIG. 6A is an electrical circuit diagram of an H-type attenuator circuit.
Figure 6B:
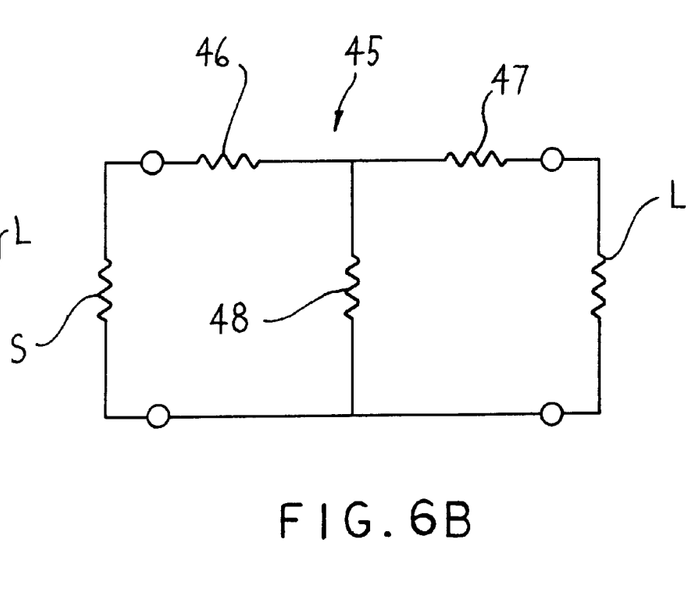
FIG. 6B is an electrical circuit diagram of a T-type attenuator circuit.

More particularly, two standard attenuator circuit designs are the H-type and T-type attenuator circuits illustrated diagrammatically in FIG. 6A and FIG. 6B respectively.

The H-type attenuator circuit 36 (FIG. 4 and 6A) is used to impedance match a balanced circuit. The H-type circuit 36 has a first source side resistor 37 serially connected to a first load side resistor 38 for joining the conducting wire 14. A second source side resistor 41 is serially connected with a second load side resistor 42 for joining the signal conducting wire 15. A bridge resistor 43 is connected between the junctions of the serially connected first resistors 37, 38 and the serially connected second resistors 41, 42. The source impedance and load impedance are represented by resistors S and L, respectively, in FIG. 6A. The values of the resistors are chosen depending on the desired characteristics and operating range of the attenuator 30 in view of the load and source impedances.

The T-type attenuating circuit 45 (FIG. 6B) includes a source side resistor 46 serially connected to a load side resistor 47 connecting the conducting wires 14. The conducting wire 15 extends through the T-type circuit 45. A bridge resistor 48 is connected at one end thereof between the serially connected resistors 46, 47 and at the other end to the conducting wire 15 extending through the attenuating circuit 45. The T-type attenuating circuit 45 is used for matching impedances of unbalanced circuits between the source S and the load L.

The attenuating circuit 30 illustrated in FIGS. 4 and 5 is the H-type attenuating circuit, the configuration of which was discussed above. The skilled artisan will readily appreciate that the T-type circuit could also be used. Alternatively, while the circuit 30 disclosed herein is an attenuator, the skilled artisan will also appreciate that the circuit 30 could be formed as a different type of electrical circuit such as lowpass/highpass filters, phantom-powered active filters or line amps that could be connected serially between the adjacent end sections 27 of the cable lengths 12.

In the illustrated embodiment, the attenuating circuit 30 is mounted on a circuit board 32 using conventional techniques wherein the separate resistors 37, 38, 41 and 42 are electrically connected together by circuit board traces 58. The exposed wires 16 of the conducting wires 14, 15 are fixed onto the circuit board 32 at contacts 59 which are located at the opposite ends of the circuit board 32.

The attenuating circuit 30' illustrated in FIG. 5 is a resistor circuit joined at soldered locations 33 including the locations 33 where the exposed wires 16 of the conducting wires 14, 15 are joined to the circuit 30'. The resistors 37', 38', 41' and 42' are folded together in a relatively compact arrangement of resistors.

Either of the circuits 30 and 30' are supported within the housing 50 solely by the wires 14, 15 and no additional mechanical connectors between the attenuator circuit 30 and the cable lengths 12 are required. The wires 14, 15 and attenuator circuits 30 and 30' are fixed together, for example only by soldering so as to form an electrical connection therebetween. While the remaining discussion refers to the attenuator 30 of FIG. 4, it should be understood that this discussion applies equally to the attenuator 30' of FIG. 5.

Once the attenuator circuit 30 is connected to the wires 14, 15, a tubular sleeve 60 is provided around the circuit 30 as well as a portion of the wires 14, 15 that are joined to the circuit 30 to protect the joined locations therebetween. The sleeve 60 preferably is a heat shrink material which, when heated, shrinks tightly around the end portions of the wires 14, 15 and circuit 30, thereby reinforcing the connections between the wires 14, 15 and circuit 30 and preventing dirt, debris, or liquid from entering within the sleeve 60. The temperature at which the heat shrink sleeve shrinks is chosen such that it does not damage any adjacent elements of the cable lengths 12 or the in-line attenuator 30.

Once the cable lengths 12 are electrically connected together by the attenuator circuit 30, the hollow housing 50 is rigidly secured to the adjacent or proximal ends 26 of the cable lengths 12. Generally, the hollow, rigid housing 50 is adapted to receive the circuit 30, with or without sleeve 60 within its hollow interior, to protect the circuit 30 and the connections to the wires 14, 15 from damage. The housing 50 preferably is secured onto the end sections 27 of the cable lengths 12 to enclose the circuit 30 and the end portions of the wires 14, 15 which extend beyond the end 26 of the cable lengths 12. The circuit 30 is suspended or supported within the housing 50 by the wires 14, 15 without the need for direct securement of the circuit 30 to the housing 50.

More particularly, the elongate housing 50 preferably is formed of stainless steel or other suitable rigid material which has sufficient strength to rigidly join the cable sections 12 together without bending during use. The housing 50 has a tubular or cylindrical shape which defines a hollow interior 51 that is open on its opposite ends. The hollow interior 51 encloses the attenuating circuit 30 therein with the circuit 30 being separated or spaced radially inwardly from the housing 50. The hollow interior 51 preferably has a diameter just larger than at least one of the cable lengths 12 to allow the housing 50 to slide over the one cable length 12 and be positioned coaxially with the attenuator 30.

The hollow housing 50 extends axially between the cable lengths 12 and in particular, spans the space between the adjacent ends 26 of the cable lengths 12. The end portions 52 of the housing 50 cover the end sections 27 and accordingly, are located at the mounting locations 25 of the cable lengths 12 while the intermediate portion of the housing 50 disposed between the end portions 52 serves to enclose the attenuator circuit 30 therein.

The elongate housing 50 has a relatively thin tubular or cylindrical wall configuration with the two ends 52 thereof being crimpable. The thin wall of the housing 50 and the hollow interior 51 are adapted to be just larger than the outer diameter of the cable length 12 to allow the rigid housing 50 to be only slightly diametrically larger than the cable length 12 without significantly increasing the weight or size of the cable assembly 10. Preferably, for cable lengths 12 having a diameter of approximately 5 mm, the housing 50 has an outside diameter of approximately 6 mm and a length of approximately 5–6 cm.

Generally, the housing 50 is mounted to the ends 26 of the cable lengths 12 preferably by crimping. In the illustrated arrangement of FIG. 5, the crimping process results in an annular arrangement of flats 53 formed in the housing ends 52 which extend circumferentially about the outer periphery of the end cable sections 27.

More particularly, the crimpable ends 52 of the housing 50 are crimped onto the portions 26 of the cable length 12 adjacent the attenuating circuit 30. Each annular arrangement of flats 53 has a reduced diameter relative to the intermediate portion of the housing 50 which encloses the attenuator circuit 30. The reduced diameter of the housing 50 provides a compression fit or coupling which non-removably fixedly secures the housing 50 to each cable length 12 thus forming the integral shielded cable assembly 10 with an in-line attenuator 30. The crimpable ends 52 are crimped around the entire circumference of the end portions 26 of the cable lengths 12, thus reducing the likelihood of puncturing the cable lengths 12 and exposing and/or grounding the conducting wires 14, 15.

The compressed end portions 27 of the cable lengths 12 which are compressed by the crimped ends 52 of the housing 50 further limit the flexibility of this portion of the cable length 12. The housing 50 effectively grips around the entire periphery of the end portions 27 such that the end portions 27 are generally rigid relative to the remainder of the cable lengths 12 whereby flexing of the cable lengths 12 causes little if any flexing of the wires 14, 15 within the housing 50. As a result, the housing 50 prevents axial movement of the ends 26 of the cable lengths 12 adjacent the circuit 30 which axial movement could damage the circuit 30 or the connection of the conducting wires 14, 15 to the circuit. Further, the rigid connection of the housing 50 to the cable lengths 12 prevents or limits the transmission of cable flexing either to the circuit 30 or to the solder connections between the conducting wires 14, 15 to the circuit 30.

While the housing 50 is secured in place by crimping, the ends 52 of the housing 50 may also be fixedly secured onto the end portions 26 of the cable length 12 by suitable adhesives. Here again, the housing 50 preferably is secured to the cable lengths 12 about the entire outer periphery thereof. Other suitable means for securing the housing 50 on the end portions 27 of the cable lengths 12 also may be used provided that the housing 50 adequately protects the circuit 30 and the connections thereto as discussed above.

The single tubular housing 50 replaces the multiple components of the conventional attenuators while at the same time providing a lighter construction which protects the attenuating circuit 30. Further, since the housing 50 has a diameter which is only a little larger than the outside diameter of the cable lengths 12, the cable assembly 10 has the general overall appearance and characteristics, such as the weight and flexibility, of a continuous length of cable. Still further, no mechanical connections are required for the connection of the attenuator circuit 30 to the cable lengths 12 which mechanical connections might otherwise cause interference to the signals being carried therealong.

The housing 50 also acts as a shield for the attenuating circuit 30 by contacting the shielding 22 when the outer neoprene layer 24 is partially removed from surrounding the shielding 22. Thus, the housing 50 directly contacts the shielding 22 when the ends 52 are partially crimped onto the shielding 22.

When constructing the shielded cable assembly 10 with the in-line attenuator 50, the cable lengths 12 are cut to any desired length. In the alternative, a single length of cable having the overall desired length is cut into two cable lengths at a desired location of the attenuating circuit. The outer neoprene layer 24 thereafter is removed to expose the shielding 22. The housing 50 is slid onto one of the cable lengths 12 so that it is positioned adjacent the end portion 26. The shielding 22, inner neoprene layer 21, and insulation 19 are cut back from the desired location of the circuit 30 so as to expose the signal conducting wires 14, 15. Next, the conductors 16 of the wires 14, 15 are exposed and connected to the attenuating circuit 30 by soldering. The sleeve 60 may then be slid over a section of the conducting wires 14, 15 and the circuit 30. The sleeve 60 is fixed in place, for example by heat shrinking.

To rigidly secure the cable lengths 12 together and enclose the attenuator circuit 30, the housing 50 is slid over one of the cable lengths 12 such that the ends 52 of the housing 50 extend over the exposed shielding 22 and over the outer neoprene layer 24 of the cable end sections 27. The ends 52 are preferably crimped to provide a circumferential compression coupling fixedly securing the ends 52 to the cable end sections 27. Hence, the housing 50 is connected to the cable lengths 12, thus achieving a rigid connection between the two cable lengths 12. The flexibility of the cable lengths 12, however, is maintained since the axial length of the rigid housing 50 is relatively short compared to the overall length of the cable assembly 10.

Figure 7:
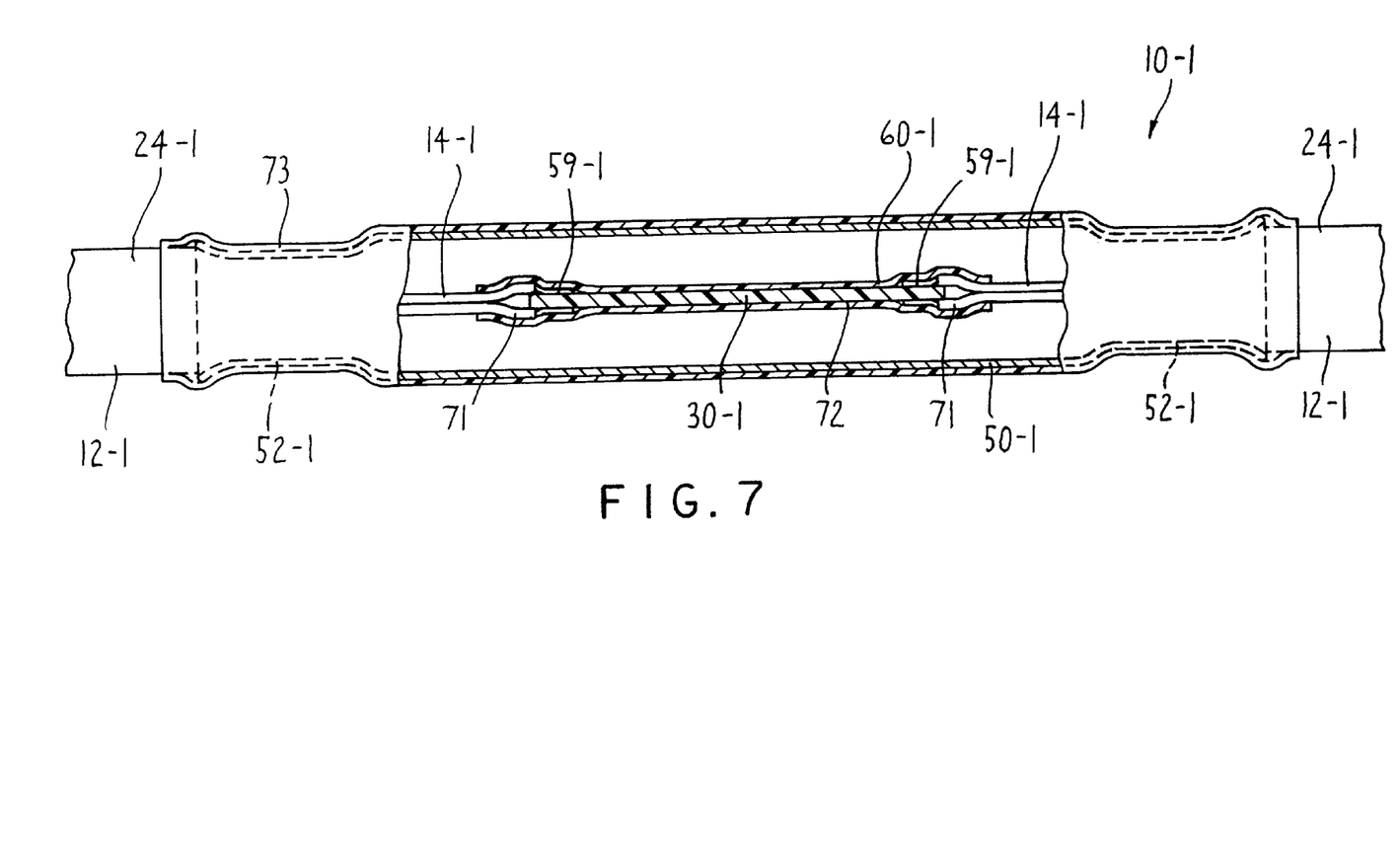
FIG. 7 is a cross-sectional view of a second embodiment of the invention.

Referring to FIG. 7, an alternative preferred embodiment of the invention is illustrated wherein common component parts which correspond to components of the embodiments illustrated in FIGS. 1–6B are identified with the same reference numeral designated with "-1". The common component parts are formed substantially the same as those corresponding components described herein with the following discussion being primarily directed to the differences between the component parts.

In particular, the cable assembly 10-1 of the second embodiment includes a tubular housing 50-1 which joins two lengths of cable 12-1 together. Unlike the cable assembly 10, however, the opposite ends of the tubular housing 50-1 are crimped to the outer neoprene layer 24-1. Otherwise, the opposite ends 52-1 of the housing 50-1 are connected to the cable lengths 12-1 in substantially the same manner as described above with respect to the cable assembly 10.

While the cable lengths 12-1 are substantially the same as the cable lengths 12, the cable lengths 12-1 not only include wires 14-1 and 15-1, only wire 14-1 being illustrated in FIG. 7, the cable lengths 12-1 also include a third shield wire 71 which extends axially therethrough and serves the same function of the shielding 22.

The attenuator circuit 30-1 is formed the same as the attenuator circuit 30 except that the bottom surface 72 thereof is formed of an electrically conductive material to define a ground plane. While the wires 14-1 and 15-1 are connected to the contacts 59-1 on the top of the attenuator circuit 30-1, the shield wire 71 is soldered to the ground plane 72 such that the shield wire 71 of the two cable lengths 12-1 are electrically connected together.

The attenuator 30-1 is thereby suspended between the wires 14-1, 15-1 and 71 and is enclosed by a heat shrink sleeve 60-1.

The preferred cable assembly 10-1 also includes an additional heat shrink sleeve 73 which extends about the outer circumference of the housing 50-1. The sleeve 73 preferably is formed of the same material as the sleeve 60-1 and serves to insulate and protect the metal tubing 50-1 from exterior sources of contamination. The sleeve 73 also may serve as a label for the cable assembly 10. The inventive cable assemblies 10 and 10-1 with the in-line attenuating circuits 30 and 30-1 are readily usable with other types of circuits requiring protection from external forces and flexing of adjacent cable lengths 12 and 12-1. The invention may also be used with other types and lengths of electrical cable depending on the specific duties of the cable. For example, the cable may have an increased length, size, or number of conducting wires.

Although a particular preferred embodiment of the invention has been disclosed in detail for illustrative purposes, it will be recognized that variations or modifications of the disclosed apparatus, including the rearrangement of parts, lie within the scope of the present invention.

The embodiments of the invention in which an exclusive property or privilege is claimed are defined as follows:

1. A shielded cable with an in-line electrical circuit, comprising separate first and second cable lengths of electrical cable having electrical wires extending therealong and separated end portions which are disposed adjacent to each other and include free ends of said electrical wire, an electrical circuit electrically connected to said free ends of said electrical wires wherein said separate first and second cable lengths are electrically coupled together, and a rigid hollow housing surrounding said electrical circuit having a compression coupling at each end of said housing, each said compression coupling non-removably rigidly securing said housing to adjacent end portions of said first and second cable lengths on opposite sides of said electrical circuit, opposite ends of said electrical circuit being supported by said wires and said adjacent end portions of said first and second cable lengths being rigidly joined together by said housing.

2. The shielded cable according to claim 1, wherein said compression couplings are crimpable ends of said housing.

3. The shielded cable according to claim 2, wherein said electrical circuit is an H-type attenuator circuit.

4. The shielded cable according to claim 3, wherein said electrical circuit is surface mounted on a circuit board positioned within said housing.

5. The shielded cable according to claim 2, wherein said electrical circuit is a T-type attenuator circuit.

6. The shielded cable according to claim 1, wherein said housing is spaced radially outwardly from said electrical circuit to define a radial space between aid housing and said electrical circuit.

7. The shielded cable according to claim 1, wherein each of said first and second cable lengths has a shielding layer therein, and wherein said housing is in contact with said shielding layer such that said housing acts as a circuit shielding layer around said electrical circuit.

8. The shielded cable according to claim 1, wherein each of said first and second cable lengths includes a flexible outer layer wherein said outer layers of said first and second cable lengths surround said electrical wires.

9. The shielded cable according to claim 8, wherein said outer layer of said first and second cable lengths are spaced apart from each other between said adjacent end portions, said outer layers being rigidly held together in longitudinally spaced relation by said housing which extends longitudinally therebetween.

10. A method for producing a shielded cable from two separated lengths of electrical cable, an in-line electrical circuit, and a rigid hollow housing, comprising the steps of:

positioning proximal ends of said separated lengths of cable in closely adjacent but spaced relation, said lengths of cable including a plurality of conducting wires which have separated wire ends projecting from said proximal ends;

joining said electrical circuit to said wire ends of said conducting wires such that said lengths of cable are electrically connected together;

sliding said hollow housing along one of said lengths of cable until opposite ends of said hollow housing overlie said proximal ends of said lengths of cable and an intermediate section of said hollow housing defined between said opposite ends surrounds said electrical circuit; and securing said housing in place over said electrical circuit by compressing said opposite ends of said housing to define compression couplings between said opposite ends of said housing and said adjacent proximal ends of said lengths of cable such that said lengths of cable are rigidly held together by said housing.

11. The method according to claim 10, wherein the step of securing said housing by said compression couplings includes the step of crimping said opposite ends of said housing to rigidly join said housing at each of said opposite ends thereof to said lengths of cable.

12. The method according to claim 10, wherein an annular space is defined between an interior surface of said housing and said electrical circuit.

13. The method according to claim 10, wherein the step of joining said electrical circuit to said conducting wires includes the step of soldering said wire ends of said conducting wires to corresponding electrical contacts on said electrical circuit.

14. The method according to claim 13, further including the step of providing mechanical connectors at distal ends of said lengths of cable which are disposed opposite said proximal ends thereof.

15. An electrical cable comprising:

separate first and second cable lengths which are flexible and are arranged coaxially relative to each other, said first and second cable lengths having proximal cable ends located adjacent each other and distal cable ends extending away from said proximal ends, each of said first and second cable lengths including electrical conductors which extend longitudinally therethrough and an exterior sheath covering said conductors, each of said conductors including an exposed conductor end section which is accessible through said exterior sheath at said respective proximal cable end, said proximal cable ends being longitudinally spaced apart so as to define an intermediate space between said exterior sheaths and said conductor end sections;

an electrical circuit disposed in said intermediate space which includes first and second electrical contact sections;

said first and second electrical contact sections being electrically connected to said conductor end sections of said conductors of said first and second cable lengths respectively wherein said first and second cable lengths are electrically connected together, said electrical circuit being disposed in said intermediate space between said proximal cable ends and being supported by said conductors; and a hollow housing extending coaxially with said first and second cable lengths between said proximal cable ends thereof, said housing defining a hollow interior in which said electrical circuit is received and having opposite open ends which are rigidly connected to said proximal cable ends of said first and second cable lengths, said housing being rigid so as to rigidly join said first and second cable lengths together with said electrical circuit being supported therebetween within said hollow interior.

16. The electrical cable according to claim 15, wherein said housing is a rigid tube which includes end sections at the opposite open ends thereof which each extend along a partial length of said housing, said end sections receiving said respective proximal ends of said first and second cable lengths therein, said housing being connected to said first and second cable lengths solely at said end sections.

17. The electrical cable according to claim 16, wherein each of said end sections of said housing is connected to a respective one of said proximal ends about substantially the entire outer periphery thereof.

18. The electrical cable according to claim 15, wherein said housing is a rigid metal tube, opposite end sections of said housing being located at said opposite open ends and being crimped onto said proximal cable ends for the connection of said housing therewith.

19. The electrical cable according to claim 15, wherein said housing is rigid and nonbendable such that said housing prevents flexing of said electrical circuit contained therein during flexing of at least one of said first and second cable lengths.

20. The electrical cable according to claim 15, wherein said first and second electrical contact sections and said conductor end sections are soldered together.

21. The electrical cable according to claim 15, wherein said electrical circuit comprises an attenuator.

22. The electrical cable according to claim 15, wherein each of said first and second cable lengths includes at least two of said conductors.

23. A shielded cable with an in-line attenuator, comprising a length of electrical cable having electrical wires extending therealong, an attenuating circuit electrically connected to said electrical wires within the length of cable, and a rigid hollow housing surrounding said attenuating circuit having a compression coupling at each end of said housing, each said compression coupling non-removably rigidly securing said housing to adjacent but separate end portions of said length of cable on opposite sides of said attenuating circuit, opposite ends of said attenuating circuit being supported by said wires and said adjacent end portions of said length of cable being rigidly joined together by said housing, said electrical circuit being surface mounted on a circuit board disposed within said housing.

* * * * *

UNITED STATES PATENT AND TRADEMARK OFFICE
CERTIFICATE OF CORRECTION

PATENT NO. : 5,929,719
DATED : July 27, 1999
INVENTOR(S) : Mark Turner

It is certified that error appears in the above-indentified patent and that said Letters Patent is hereby corrected as shown below:

Column 9, line 26; change "aid" to ---said---.

Column 10, line 3; delete "thereof".

Signed and Sealed this

Fourteenth Day of March, 2000

Attest:

Q. TODD DICKINSON

Attesting Officer

Commissioner of Patents and Trademarks